(12) United States Patent
Lee

(10) Patent No.: US 7,773,444 B2
(45) Date of Patent: Aug. 10, 2010

(54) SEMICONDUCTOR MEMORY DEVICE AND DATA WRITE AND READ METHODS THEREOF

(75) Inventor: Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 744 days.

(21) Appl. No.: 11/560,223

(22) Filed: Nov. 15, 2006

(65) Prior Publication Data

US 2007/0189068 A1 Aug. 16, 2007

(30) Foreign Application Priority Data

Feb. 15, 2006 (KR) .................. 10-2006-0014852

(51) Int. Cl.
G11C 7/06 (2006.01)
G11C 7/14 (2006.01)
(52) U.S. Cl. .................. 365/210.1; 365/185.2
(58) Field of Classification Search ............ 365/185.01, 365/185.11, 185.13, 185.2, 185.21, 186, 365/189.07, 210.1
See application file for complete search history.

(56) References Cited

U.S. PATENT DOCUMENTS

| | | | |
|---|---|---|---|
| 6,351,423 B2 | 2/2002 | Ooishi | |
| 6,567,330 B2 | 5/2003 | Fujita et al. | |
| 6,882,008 B1 | 4/2005 | Ohsawa | |
| 6,888,770 B2 | 5/2005 | Ikehashi | |
| 6,980,474 B2 | 12/2005 | Ohsawa | |
| 2003/0231524 A1 | 12/2003 | Ohsawa | |
| 2005/0047234 A1* | 3/2005 | Kamata | 365/205 |
| 2005/0068807 A1 | 3/2005 | Ohsawa | |
| 2005/0226070 A1* | 10/2005 | Ohsawa | 365/207 |
| 2006/0007753 A1 | 1/2006 | Choi et al. | |

(Continued)

FOREIGN PATENT DOCUMENTS

CN 1571070 1/2005

(Continued)

OTHER PUBLICATIONS

English language abstract for Japanese Publication No. 2003-196982.

(Continued)

Primary Examiner—VanThu Nguyen
Assistant Examiner—Douglas King
(74) Attorney, Agent, or Firm—Volentine & Whitt, PLLC

(57) ABSTRACT

A semiconductor memory device having a first memory cell array block including a memory cell having a floating body, the memory cell coupled to a word line, a first bit line, and a first source line, a second memory cell array block including a reference memory cell having a floating body, the reference memory cell coupled to a reference word line, a second bit line, and a second source line, a first isolation gate portion configured to selectively transmit a signal between the first bit line and at least one of a sense bit line and an inverted sense bit line, a second isolation gate portion configured to selectively transmit a signal between the second bit line and at least one of the sense bit lines, and a sense amplifier configured to amplify voltages of the sense bit line and the inverted sense bit line to first and second sense amplifying voltage levels.

24 Claims, 4 Drawing Sheets

U.S. PATENT DOCUMENTS

2006/0044794 A1*  3/2006  Hatsuda et al. ............. 362/210

FOREIGN PATENT DOCUMENTS

JP        2003-196982       11/2003

OTHER PUBLICATIONS

Takashi Ohsawa et al., "Memory Design Using a One-Transistor Gain Cell on SOI," IEEE Journal of Solid-State Circuits, vol. 37, No. 11, Nov. 2002.

S. Okhonin et al., "A Capacitor-Less 1T-DRAM Cell," IEEE Electron Device Letters, vol. 23, No. 2, Feb. 2002.

* cited by examiner

SEMICONDUCTOR MEMORY DEVICE AND DATA WRITE AND READ METHODS THEREOF

This application claims the benefit of Korean Patent Application No. 2006-14852, filed Feb. 15, 2006, the contents of which are hereby incorporated herein by reference in their entirety.

BACKGROUND

1. Technical Field

This disclosure relates to a semiconductor memory device, and more particularly, to a semiconductor memory device including a dynamic memory cell composed of a transistor with a floating body, and data write and read methods thereof.

2. Description of Related Art

A typical dynamic memory cell includes one access transistor and one data storage capacitor. When the data storage capacitor is charged, data "1" is stored; while when no charge is charged in the data storage capacitor, data "0" is stored. However, since the charge in the data storage capacitor is lost after a predetermined time elapses, a refresh (restore) operation should be performed.

In addition, since the typical dynamic memory cell needs the capacitor, when a memory cell array is includes the typical dynamic memory cells, layout area must be used for capacitors, thus there is a limit to how much the layout area of a semiconductor memory device may be reduced.

For this reason, a transistor having a floating body has been proposed. In this transistor, the floating body, which stores majority carriers, may need to be refreshed because the stored majority carriers are lost after a predetermined time elapses. Thus, although a memory cell including a transistor with a floating body does not include a capacitor unlike a typical memory cell, the memory cell including the transistor with the floating body operates similarly to the capacitor so that it can be used as a dynamic memory cell.

In other words, the transistor having the floating body constitutes one memory cell. Thus, assuming that a semiconductor memory device with a particular capacity is fabricated using memory cells with a transistor having a floating body, the semiconductor memory device including memory cells with transistor having a floating body has a smaller layout area than that of a semiconductor memory device including a typical memory cell.

FIG. 1 illustrates a conventional semiconductor memory device including a memory cell with a floating body. The semiconductor memory device includes memory cell array blocks BLK1 and BLK2, bit line selectors 10-11 to 10-1m and 10-21 to 10-2m, a reference bit line selector 12-1, level limiters 14-1 to 14-m, 14-(m+1), sense amplifiers 16-1 to 16-m, a reference voltage generator 18, comparators COM1 to COMm, latches LA1 to LAm, write back gates WBG1 to WBGm, read column selection gates RG1 to RBm, write column selection gates WG1 to WGm, and a reference write column selection gate RWG.

Each of the memory cell array blocks BLK1 and BLK2 includes memory cells MC and reference memory cells RMC. During a write operation, when a predetermined voltage (e.g., 1.5 V) is applied to the corresponding word line and a voltage higher than the predetermined voltage (e.g., over 1.5 V) is applied to the corresponding bit line, a lot of electron-hole pairs are generated due to impact ionization near the drain of an NMOS transistor of the corresponding memory cell MC. Here, electrons are absorbed in the drain of the NMOS transistor and holes are stored in a floating body, so that data "1" is written. That is, when the data "1" is written, the NMOS transistor operates in a saturation region. On the other hand, when a predetermined voltage (e.g., 1.5 V) is applied to the corresponding word line and a voltage (e.g., −1.5V) lower than the predetermined voltage is applied to the corresponding bit line, the floating body and the drain of the NMOS transistor are forward-biased, so that the holes stored in the floating body are mostly discharged to the drain. As a result, data "0" is written.

When the data "1" is stored, the threshold voltage of the NMOS transistor decreases, and when the data "0" is stored, the threshold voltage of the NMOS transistor increases. In addition, during a read operation, when a predetermined voltage (e.g., 1.5 V) is applied to the corresponding word line and a voltage for operating of the NMOS transistor in a linear region (e.g., 0.2 V) is applied to the corresponding bit line, a current difference occurs in the corresponding bit line. By sensing the current difference, the memory cell reads data "0" and data "1." When the memory cell stores data "1," a bit line current generated when the data "1" is read increases due to a low threshold voltage. By comparison, when the memory cell stores data "0," a bit line current generated when the data "0" is read decreases due to a high threshold voltage.

Each of the bit line selectors 10-11 to 10-1m and 10-21 to 10-2m selects one of the k bit lines BL1 to BLk of each of sub memory cell array blocks SBLK11 to SBLK1m and SBLK21 to SBLK2m in response to each of bit line selection signals BS1 to BSk and couples the selected bit line with the corresponding one of sense bit lines SBL1 to SBLm. Each of the reference bit line selectors 12-1 and 12-2 connects reference bit lines RBL1 and RBL2 of each of reference memory cell array blocks RBLK1 and RBLK2 with a reference sense bit line RSBL in response to the corresponding one of reference bit line selection signals RBS1 and RBS2.

Each of the level limiters 14-1 to 14-m, and 14-(m+1) cuts off the supply of the corresponding one of currents Ic1 to Ic(m+1) to the corresponding one of the sense bit lines SBL1 to SBLm and the reference sense bit line RSBL when the corresponding one of the sense bit lines SBL1 to SBLm and the reference sense bit line RSBL is at a higher voltage level than a limited voltage VBLR. That is, when the level of the limited voltage VBLR is set to 0.2 V, a voltage for a read operation is applied to the bit lines BL1 to BLk and the reference bit lines RBL1 and RBL2 due to the level limiters 14-1 to 14-(m+1) so as to allow the flow of the corresponding one of the currents Ic1 to Ic(m+1). Here, the reason that the limited voltage VBLR is set to a low level of 0.2 V is that when the limited voltage VBLR is set to a higher level than 0.2V, the NMOS transistor with the floating body is biased in a saturated state so that when data "0" is read, data "1" may be read incorrectly due to impact ionization. The reference voltage generator 18 generates a reference voltage VREF corresponding to the current Ic(m+1). Each of the sense amplifiers 16-1 to 16-m senses the corresponding one of the currents Ic1 to Icm and generates a voltage corresponding to the sensed current. The reference voltage VREF generated by the reference voltage generator 18 is between voltages corresponding to the data "0" and the data "1," which are output from each of the sense amplifiers 16-1 to 16-m.

The write and read operations of the semiconductor memory device shown in FIG. 1 will now be described.

First, the write operation of the reference memory cells RMC will be described.

When a voltage of 1.5 V is applied to the word line WL11 and the reference bit line selection signal RBS1 is activated, the reference bit line RBL1 is coupled to the reference sense bit line RSBL. When a reference write column selection signal RWCSL is activated, an NMOS transistor N7 is turned on, and thus data transmitted to a write data line WD is transmitted through the reference sense bit line RSBL to the reference bit line RBL1. In this case, when write data has a voltage of −1.5 V, data "0" is written in the reference memory cell RMC connected between the word line WL11 and the reference bit line RBL1. In the same manner, the data "0" is written in all the reference memory cells RMC connected between other word lines and the reference bit lines RBL1. In addition, data "1" is written in all the reference memory cells RMC connected between the word lines WL11 to WL1$n$ and WL21 to WL2$n$ and the reference bit lines RBL2. In this case, write data may have a voltage of 1.5 V.

In other words, data "0" is written in the reference memory cells RMC connected to the reference bit lines RBL1 of the respective reference memory cell array blocks RBLK1 and RBLK2, and data "1" is written in the reference memory cells RMC connected to the reference bit lines RBL2 thereof. Thus, the reference memory cells RMC to the reference bit lines RBL1 and RBL2 of the respective reference memory cell array blocks RBLK1 and RBLK2 are used to generate the reference voltage VREF during the read operation.

Next, the write operation of the memory cell MC will be described. When a voltage of 1.5 V is applied to the word line WL11 and the bit line selection signal BS1 is activated, the bit line BL1 is connected to the sense bit line SBL1. When a write column selection signal WCSL1 is activated, an NMOS transistor N6 is turned on. In this case, when a voltage of −1.5 V is applied to the write data line WD, the voltage is applied through the sense bit line SBL1 to the bit line BL1 so that data "0" is written in the memory cell MC connected between the word line WL11 and the bit line BL1. On the other hand, when a voltage of 1.5 V is applied to the write data line WD, data "1" is written. In the same manner, all the memory cells MC perform the write operation.

The read operation of the memory cells MC will now be described. When a voltage of 1.5 V is applied to the word line WL11 and the bit line selection signal BS1 is activated, the bit line BL1 is connected to the sense bit line SBL1 so that a signal is transmitted from the bit line BL1 to the sense bit line SBL1. In this case, the reference bit line selection signals RBS1 and RBS2 are activated at the same time, and thus the reference bit lines RBL1 and RBL2 are connected to the reference sense bit line RSBL, and a signal is transmitted from the reference bit lines RBL1 and RBL2 to the reference sense bit line RSBL.

The level limiter 14-1 prevents the supply of current from an output node of the level limiter 14-1 to the sense bit line SBL1 when the sense bit line SBL1 is at a higher voltage level than the limited voltage VBLR, so that the sense bit line SBL1 remains at a lower voltage level than the limited voltage VBLR. Also, the level limiter 14-1 generates the current Ic1 corresponding to data stored in the memory cell MC. The level limiter 14-($m$+1) prevents the supply of current from an output node of the level limiter 14-($m$+1) to the reference sense bit line RSBL when the reference sense bit line RSBL is at a higher voltage level than the limited voltage VBLR, so that the reference sense bit line RSBL remains at a lower voltage level than the limited voltage VBLR. Also, the level limiter 14-($m$+1) generates the current Ic(m+1) corresponding data stored in the reference memory cell RMC.

The sense amplifier 16-1 senses the current Ic1 and generates a sensing voltage sn1. The reference voltage generator 18 senses the current Ic(m+1) and generates a reference voltage VREF. The comparator COM1 is enabled in response to the sense amplifier enable signal SEN, compares the sensing voltage sn1 generated by the sense amplifier 16-1 with the reference voltage VREF, and generates sensing data. That is, when the sensing voltage sn1 generated by the sense amplifier 16-1 is lower than the reference voltage VREF, the comparator COM1 outputs a high-level signal to the corresponding node "a." Inversely, when the sensing voltage sn1 is higher than the reference voltage VREF, the comparator COM1 outputs a low-level signal to the corresponding node "a." The latch LA1 latches the sensing data.

In addition, when a read column selection signal RCSL1 is activated, NMOS transistors N2 and N4 are turned on. In this case, when the node "a" is at a high level, an NMOS transistor N5 is turned on and transmits low-level data to an inverted read data line RDB. On the other hand, when a node "b" is at a high level, an NMOS transistor N3 is turned on and transmits the low-level data to a read data line RD. That is, the low-level data is transmitted to the read data line RD or the inverted read data line RDB during the read operation.

After the read operation, when the write back signal WB is activated, an NMOS transistor N1 is turned on, so that high-level data is transmitted from the sense bit line SBL1 to the bit line BL1. Thus, a refresh operation is performed on the memory cell MC that stores data "1" and is connected between the word line WL11 and the bit line BL1. In the same manner, all the memory cells MC perform the read operation.

Thus, in order to perform a read operation, a conventional semiconductor memory device including memory cells with a floating body, a complicated circuit configuration including level limiters, sense amplifiers, comparators, latches, and write back gates as shown in FIG. 1 is needed.

Also, for the conventional semiconductor memory device, a long period of time is needed to perform a refresh operation. This is because a circuit configuration connected between a pair of sense bit lines, which is used for a read operation (or a refresh operation), is shared by k pairs of bit lines. In other words, one word line needs to be activated k times so that all the memory cells can perform the refresh operation.

SUMMARY OF THE INVENTION

An embodiment includes a semiconductor memory device having a first memory cell array block including a memory cell having a floating body, the memory cell coupled to a word line, a first bit line, and a first source line, a second memory cell array block including a reference memory cell having a floating body, the reference memory cell coupled to a reference word line, a second bit line, and a second source line, a first isolation gate portion configured to selectively transmit a signal between the first bit line and at least one of a sense bit line and an inverted sense bit line, a second isolation gate portion configured to selectively transmit a signal between the second bit line and at least one of the sense bit lines and the inverted sense bit line, and a sense amplifier configured to amplify voltages of the sense bit line and the inverted sense bit line to first and second sense amplifying voltage levels.

Another embodiment includes a semiconductor device including memory cell array blocks, each memory cell block including bit lines, word lines, a reference word line, memory cells having floating bodies where each bit line is coupled to a corresponding subset of the memory cells, and reference memory cells having floating bodies and coupled to the reference word line where each bit line also coupled to a corresponding reference memory cell. In addition, the semiconductor device includes isolation gates with each isolation gate coupled to the bit lines of a corresponding memory cell array block, and sense amplifiers coupled to the isolation gates.

Another embodiment includes a method of operating a semiconductor memory device including memory cells having floating bodies. The method includes activating a word line of a first memory cell array, activating a reference word line of a second memory cell array, coupling a bit line of the first memory cell array to a sense bit line of a sense amplifier, coupling a bit line of the second memory cell array to an inverted sense bit line of the sense amplifier, and amplifying a difference between the sense bit line and the inverted sense bit line.

BRIEF DESCRIPTION OF THE DRAWINGS

The foregoing and other objects, features and advantages will become apparent from the following detailed description of embodiments in reference to the accompanying drawings. The drawings may not necessarily be to scale, emphasis instead being placed upon illustrating the embodiments.

DETAILED DESCRIPTION OF THE INVENTION

Embodiments of a semiconductor memory device and data write and read methods thereof will now be described more fully hereinafter with reference to the accompanying drawings.

Figure 1:
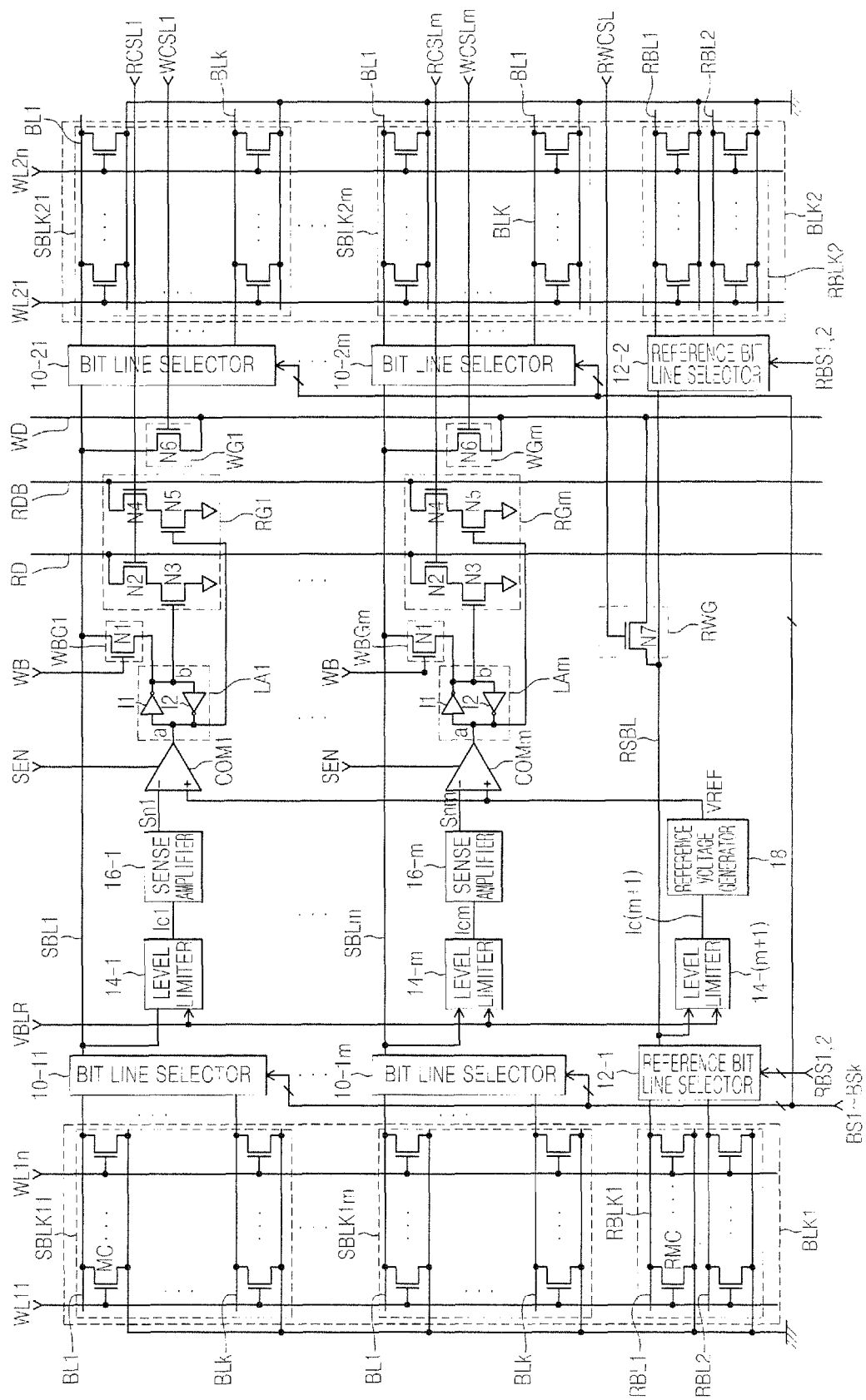
FIG. 1 illustrates a conventional semiconductor memory device including a memory cell with a floating body.
Figure 2:
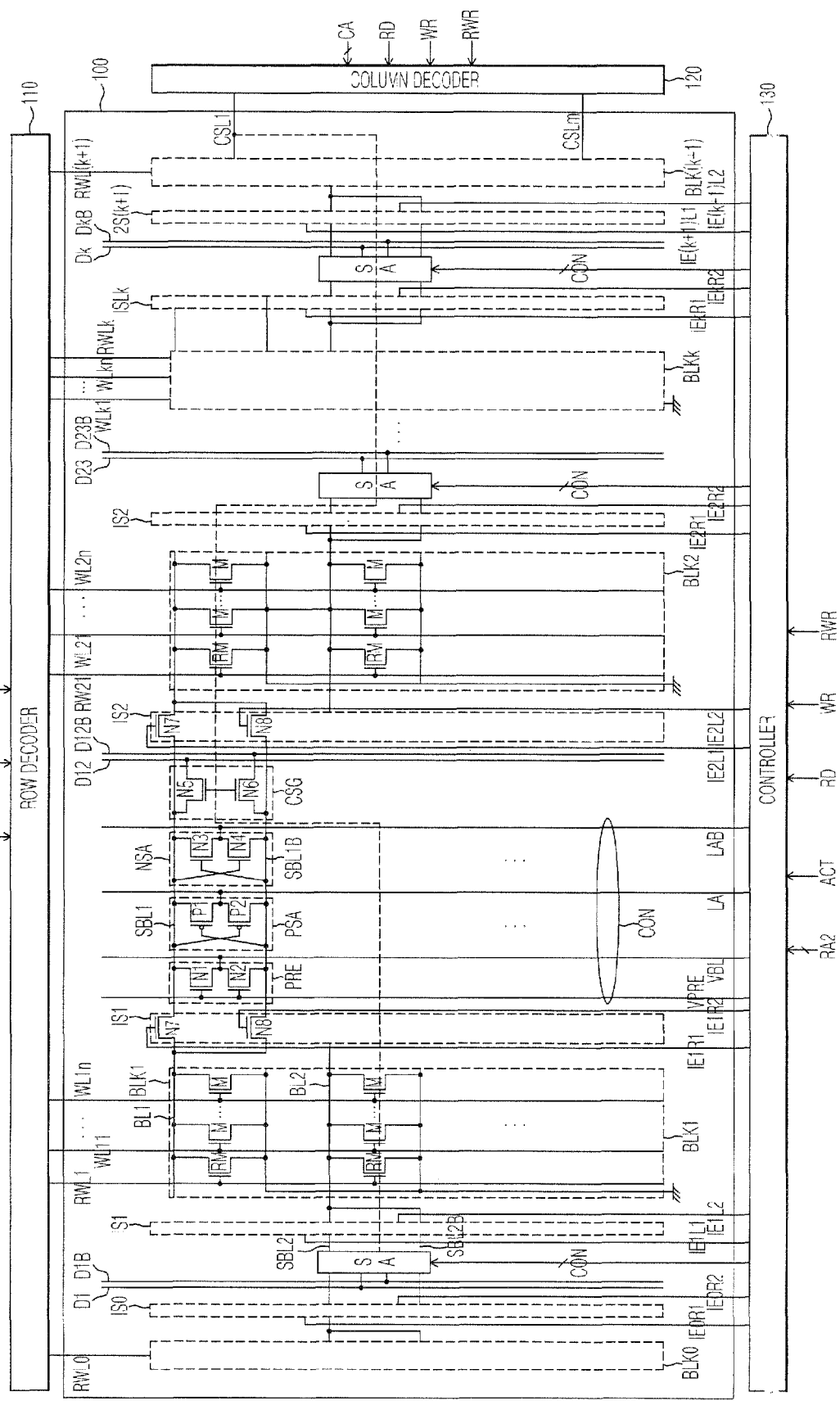
FIG. 2 is a block diagram of a semiconductor memory device according to an embodiment.

FIG. 2 is a block diagram of a semiconductor memory device according to an embodiment. The semiconductor memory device includes a memory cell array 100, a row decoder 110, a column decoder 120, and a controller 130, and the memory cell array 100 includes memory cell array blocks BLK0 to BLK(k+1), isolation gates IS0 to IS(k+1), precharge circuits PRE, sense amplifiers PSA and NSA, and column selection gates CSG.

In FIG. 2, each block "SA" denotes a sense amplifier circuit including the precharge circuit PRE, the bit line sense amplifier PSA and NSA, and the column selection gate CSG.

The precharge circuit PRE includes NMOS transistors N1 and N2. The sense amplifier includes a PMOS sense amplifier PSA and an NMOS sense amplifier NSA. The PMOS sense amplifier PSA includes PMOS transistors P1 and P2. The NMOS sense amplifier NSA includes NMOS transistors N3 and N4. The column selection gate CSG includes NMOS transistors N5 and N6. Each of the isolation gates IS1 to ISk includes NMOS transistors N7 and N8.

The semiconductor memory device shown in FIG. 2 is configured such that two pairs of data may be input and output through two pairs of data lines disposed on both sides of the memory cell array blocks BLK1 to BLKk.

In FIG. 2, each of the memory cell array blocks BLK1 to BLKk includes reference NMOS transistors RM and NMOS transistors M. Each reference NMOS transistor has a floating body and a gate coupled to a reference word line RWL, a drain coupled to one of bit lines BL1, BL2, . . . , and a source coupled in common to a common source line. Each NMOS transistor M has a floating body and a gate coupled to one of word lines WL11 to WL1n, a drain coupled to one of bit lines BL1, BL2, . . . , and a source coupled in common to the common source line.

Each of the memory cell array blocks BLK0 and BLK(k+1) includes reference NMOS transistors RM. Each reference NMOS transistor having a floating body and a gate coupled to reference word lines RWL0 and RWL(k+1), a drain coupled to the bit lines BL1, BL2, . . . , a source coupled in common to the common source line. The reference NMOS transistors RM constitute reference memory cells, and the NMOS transistors M constitute memory cells. Also, the common source line is coupled in common to a voltage such as a ground voltage.

Although with reference to FIG. 2 the memory cell array blocks BLK0 and BLK(k+1) are described above as configured differently from the memory cell array blocks BLK1 to BLKk, the memory cell array blocks BLK0 and BLK(k+1) may have the same configuration as the memory cell array blocks BLK1 to BLKk.

Functions of the respective blocks shown in FIG. 2 will now be described.

In each of the memory cells M of the memory cell array blocks BLK1 to BLKk, during a write operation, when a predetermined voltage (e.g., 1.6 V) is applied to the corresponding one of word lines WL11 to WLkn and a higher voltage (e.g., 2.3 V) is applied to the corresponding one of the bit lines BL1, BL2, . . . , data "0" is written. Also, when a predetermined voltage (e.g., 1.6 V) is applied to the corresponding one of the word lines WL1 to WLkn and a lower voltage (e.g., −2.3 v) is applied to the corresponding one of the bit lines BL1, BL2, . . . , data "1" is written. In each of the reference memory cells RM, during a reference write operation, a predetermined voltage (e.g., 1.6 V) is applied to all the word lines RWL1 to RWLk and a predetermined voltage (e.g., 1.6 V) is applied to the corresponding one of the bit lines BL1, BL2, . . . , data of which level is between the data "1" and data "0" is written. Thus, the memory cell M in which the data "1" is stored has a low threshold voltage, the memory cell M in which the data "0" is stored has a high threshold voltage, and the reference memory cell RM in which the data of the level that is between the data "1" and data "0" is stored has an intermediate threshold voltage.

Also, during a read operation, when a predetermined voltage (e.g., 1.6 V) is applied to the corresponding one of the word lines WL11 to WLkn, the amount of current supplied to the corresponding one of the bit lines BL1, BL2, . . . becomes different. The NMOS transistors N7 of the isolation gates IS1 to ISk are turned on in response to corresponding isolation control signals (IE1L1, IE1R1) to (IEk1, IEkR1), respectively. Also, the NMOS transistors N8 of the isolation gates IS1 to ISk are turned on in response to corresponding isolation control signals (IE1L2, IE1R2) to (IEkL2, IEkR2), respectively.

The precharge circuit PRE precharges the corresponding one of pairs of sense bit lines (SBL1, SBL1B), (SBL2, SBL2B), . . . to a precharge voltage (VBL) level in response to a precharge control signal VPRE. The PMOS sense amplifier PSA senses a low-level voltage of one line of the corresponding one of the pairs of bit lines (BL1, BL1B), (BL2, BL2B), . . . and amplifies the sensed voltage to a voltage (LA) level. The NMOS sense amplifier NSA senses a high-level voltage of one line of the corresponding one of the pairs of bit lines BL1, BL1B), (BL2, BL2B), . . . and amplifies the sensed voltage to a voltage (LAB) level. For example, the voltages LA and LAB are 2.3 V and −2.3 V, respectively, during the write and read operations. In addition, the voltages LA and LAB are 1.6 V and 0 V (or −2.3 V), respectively, during the reference write operation. The column selection gates CSG transmit data between the pairs of sense bit lines (SBL1, SBL1B), (SBL2, SBL2B), . . . and the corresponding one of pairs of data (D1, D1b), (D12, D12B), ..., and (D0k, D0kB) in response to the corresponding column selection signal transmitted through column selection signal lines CSL1 to CSLm.

The row decoder 110 decodes a first row address RA1 in response to an active command ACT and selects one of the word lines WL11 to WLkn, and simultaneously selects the reference word lines RWL1 to RWLk in response to a reference write command RWR. The column decoder 120 decodes a column address CA in response to a read command RD or a write command WRY and selects one of the column selection signal lines CSL1 to CSLm.

The controller 130 receives a second row address RAD along with the active command ACT, activates isolation control signals ILE0R2, IE1L2, ..., and IE(k+1)L2 in response to the reference write command RWR in order to turn on the NMOS transistors N8 of the isolation gates IS0 to IS(k+1) disposed on both sides of all the memory cell array blocks BLK0 to BLK(k+1), disables the precharge control signal VPRE, and applies the sense amplification voltages LA and LAB, for example, 2.3 V and 1.6 V to all the sense amplifier circuits SA. Also, the controller 130 disables the precharge control signal VPRE in response to the write command WRY, activates the corresponding isolation control signals in order to turn on the NMOS transistors N8 of the isolation gates disposed on both sides of the memory cell array block designated by the second row address RAD and also turn on the NMOS transistors N7 of the isolation gates of adjacent memory cell array blocks on both sides of the designated memory cell array block, and applies the sense amplification voltages LA and LAB, for example, 2.3 V and −2.3 V to the sense amplifier circuits SA disposed on both sides of the designated memory cell array block.

In addition, the controller 130 disables the precharge control signal VPRE during a first period in response to the read command RD, activates the corresponding isolation control signals in order to turn on the NMOS transistors N7 of the isolation gates of the memory cell array block designated by the second row address RAD and turn on the NMOS transistors N8 of the isolation gates of adjacent memory cell array blocks on both sides of the designated memory cell array block, applies the sense amplification voltages LA and LAB to the sense amplifier circuits SA disposed on both sides of the designated memory cell array block during a second period, and activates the corresponding isolation control signals in order to turn on the NMOS transistors N8 of the isolation gates disposed on both sides of the designated memory cell array block during a third period. The controller 130 activates the precharge control signal VPRE and applies a predetermined precharge voltage (e.g., 1.2 V or 1.6 V) before and after the reference write operation, the write operation, and the read operation.

Figure 3:
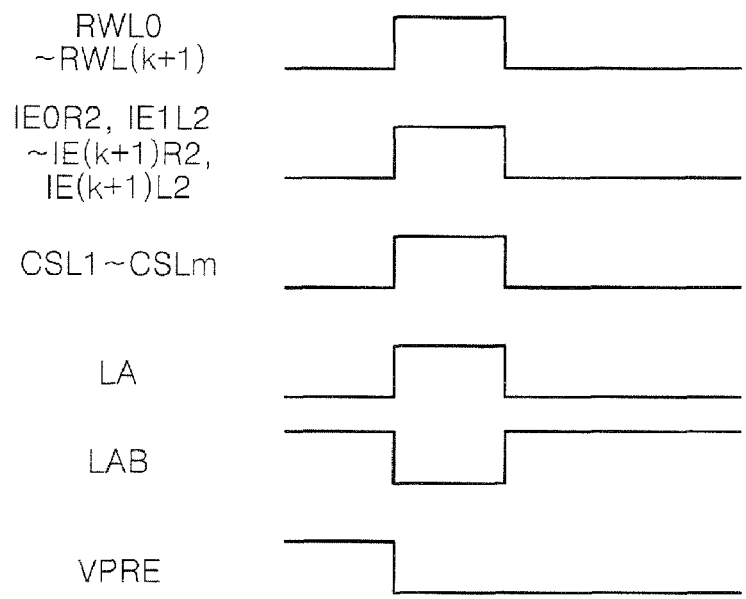
FIG. 3 is a timing diagram illustrating a reference write operation of the semiconductor memory device shown in FIG. 2.

FIG. 3 is a timing diagram illustrating the reference write operation of the semiconductor memory device shown in FIG. 2.

When the reference write command RWR is applied, the row decoder 110 activates all reference word line selection signals in order to select all the reference word lines RWL0 to RWL(k+1). For example, a voltage of 1.6 V is applied to the reference word lines RWL0 to RWL(k+1). The controller 130 activates the isolation control signals IE0R2, IE1L2, IE1R2, ..., and IE(k+1)L2 and applies predetermined levels of voltages LA and LAB for enabling the sensing operation of the all the sense amplifier circuits SA. For example, a voltage LA of 2.3 V and a voltage LAB of 0 V or 1.6 V is applied. As a result, the NMOS transistors N8 of the isolation gates IS0 to IS(k+1) are turned on.

The column decoder 120 activates all the column selection signals in order to select all the column selection signal lines CSL1 to CSLm. As a result, the NMOS transistors N5 and N6 of all the column selection gates CSG are turned on. In this case, when a pair of data (i.e., high-level data and low-level data) are applied through all pairs of data input/output lines D1/D1B to Dk/DkB, a voltage difference is generated between all the pairs of sense bit lines (SBL1, SBL1B), (SBL2, SBL2B), .... This voltage difference is amplified by the PMOS sense amplifier PSA and the NMOS sense amplifier NSA so that the voltage LA is applied to all the sense bit lines SBL1, SBL2, ... and the voltage LAB is applied to all inverted sense bit lines SBL1B, SBL2B, .... Thus, the voltage LAB is applied also to all the bit lines BL1, BL2, .... As a result, data of which level is between data "1" and data "0" is stored in all the reference memory cells RM, so that all the reference memory cells RM have a threshold voltage that is between the threshold voltage of a memory cell that stores the data "1" and the threshold voltage of a memory cell that stores the data "0." Thus, the reference memory cells RM are written in the reference write operation.

Figure 4:
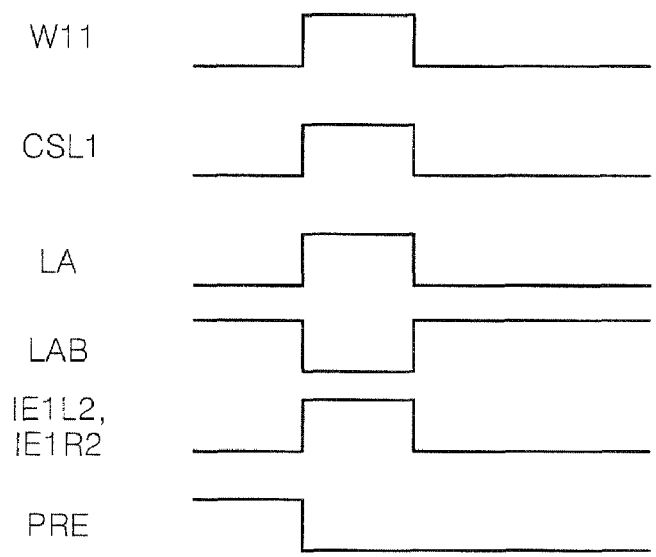
FIG. 4 is a timing diagram illustrating a write operation of the semiconductor memory device shown in FIG. 2.

FIG. 4 is a timing diagram illustrating the write operation of the semiconductor memory device shown in FIG. 2 when data "1" and data "0" are each written in the memory cells MC coupled to the word line WL11 and bit lines BL1 and BL2 of the memory cell array block BLK1.

When the active command ACT and the first and second addresses RA1 and RAD are applied, the row decoder 110 decodes the first row address RA1 and activates the word line WL11. For example, a voltage of 1.6 V is applied to the word line WL11. The controller 130 decodes the second row address RAD and activates the isolation control signals IE1L2 and IE1R2. Also, when the write command WRY and the column address CA are applied, the column decoder 120 decodes the column address CA and activates the column selection signal line CSL1.

In response to the write command WRY, the controller 130 applies the voltages LA and LAB for enabling the operation of the sense amplifier circuits SA disposed on both sides of the memory cell array block BLK1. For example, a voltage LA of 2.3 V and a voltage LAB of −2.3 V are applied. Then, the column selection gates CSG disposed on both sides of the memory cell array block BLK 1 are turned on, and the NMOS transistors N8 of the isolation gates IS1 disposed on both sides of the memory cell array block BLK1 are turned on. Thus, pairs of data lines (D1, D1B) and (D12, D12B) are coupled to the corresponding pairs of sense bit lines (SBL1, SBL1B), (SBL2, SBL2B), and the corresponding inverted sense bit lines SBL1B and SBL2B are coupled to the corresponding bit lines BL1 and BL2 of the memory cell array block BLK1. Accordingly, the pair of data (low-level data and high-level data) in the pair of data lines (D1, D1B) are transmitted to the pair of sense bit lines (SBL2, SBL2B), and the pair of data (high-level data and low-level data) in the pair of data lines (D12, D12B) are transmitted to the pair of sense bit lines (SBL1, SBL1B).

The voltages of the pairs of sense bit lines (SBL1, SBL1B) and (SBL2, SBL2B) are amplified by the sense amplifiers PSA and NSA. For example, the pair of sense bit lines (SBL1, SBL1B) are amplified to 2.3 and −2.3 V, respectively, and the pair of sense bit lines (SBL2, SBL2B) are amplified to −2.3 and 2.3 V, respectively. As a result, data "1" is written in the memory cell M coupled to the word line W11 and bit line BL1 of the memory cell array block BLK1, and data "0" is written in the memory cell M coupled to the word line WL11 and bit line BL2. Thus, the memory cells MC are written in the write operation.

Figure 5:
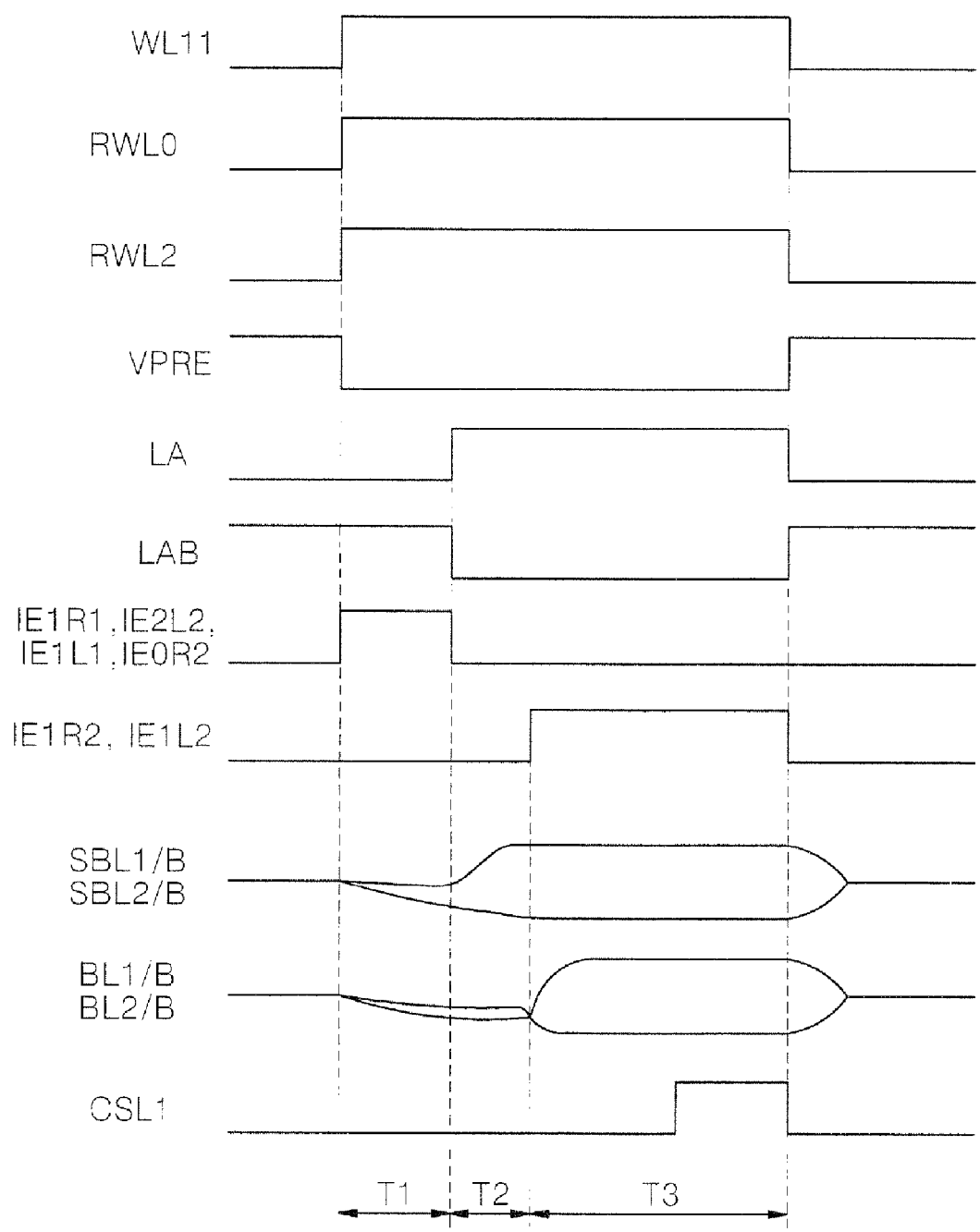
FIG. 5 is a timing diagram illustrating a read operation of the semiconductor memory device shown in FIG. 2.

FIG. 5 is a timing diagram illustrating the read operation of the semiconductor memory device shown in FIG. 2 when data "1" and data "0" are each read from the memory cells M coupled to the word line W11 and bit lines BL1 and BL2 of the memory cell array block BLK1.

When the active command ACT and the first and second addresses RA1 and RAD are applied, the row decoder 110 decodes the first row address RA1 and activates the word line W11 and the reference word lines RWL0 and RWL2. For example, a voltage of 1.6 V is applied to the word line WL11 and the reference word lines RWL0 and RWL2. The controller 130 decodes the second row address RAD and activates the isolation control signals IE1L1, IE1R1, IE0R2, and IE2L2.

Specifically, the word line WL11 and the isolation control signals IE1L1, IE1R1, IE0R2, and IE2L2 are activated during a period T1. Thus, the NMOS transistors N7 of the isolation gates IS1 disposed on both sides of the memory cell array block BLK1 and the NMOS transistors N8 of the isolation gates IS0 and IS2 disposed on both sides of the memory cell array block BLK1 are turned on. Also, the voltage of the bit line BL1 of the memory cell array block BLK1 becomes a voltage of VBL-Vth1 left after a threshold voltage Vth1 of the memory cell M that stores data "1" is subtracted from a precharge voltage VBL. The voltage of the bit line BL2 becomes a voltage of VBL-Vth0 left after a threshold voltage Vth0 of the memory cell M that stores data "0" is subtracted from the precharge voltage VBL. The voltages of the bit lines BL1 and BL2 become the voltages of the sense bit lines SBL1 and SBL2. Each of the voltage of the bit line BL1 of the memory cell array block BLK2 and the voltage of bit line BL2 of the memory cell array block BLK0 becomes a voltage of VBL-Vth(½) left after a threshold voltage Vth(½) of the reference memory cell RM that stores data of which level is intermediate between the data "1" and data "0" is subtracted from the precharge voltage VBL, and the voltages of the bit lines BL1 and BL2 of memory cell array blocks BLK0 and BLK2 become the voltages of the inverted sense bit lines SBL1B and SBL2B.

Since the threshold voltage Vth1 of the memory cell M that stores the data "1" is lower than the threshold voltage Vth(½) of the reference memory cell RM that stores the reference level between data "1" and data "0," the voltage of the sense bit line SBL1 is higher than that of the inverted sense bit line SBL1B. Similarly, the voltage of the sense bit line SBL2 is lower than that of the inverted sense bit line SBL2B since the threshold voltage Vth0 of the memory cell M that stores the data "1" is higher than the threshold voltage Vth(½) of the reference memory cell RM. As a result, voltage difference is generated between each of the pairs of sense bit lines (SBL1, SBL1B) and (SBL2, SBL2B) during the period T1.

The controller 130 disables the isolation control signals IE1L1, IE1R1, IE0R2, and IE2L2 in response to the read command RD and applies the voltages LA and LAB for enabling the operation of the sense amplifier circuits SA disposed on both sides of the memory cell array block BLK1. For example, a voltage LA of 2.3 V and a voltage LAB of −2.3 V are applied.

Specifically, the isolation control signals IE1L1, IE1R1, IE0R2, and IE2L2 are disabled and the voltages LA and LAB are applied during a period T2. Thus, the NMOS transistors N7 of the isolation gates IS1 and the NMOS transistors N8 of the isolation gates IS0 and IS1 are turned off. Also, the PMOS sense amplifier PSA and the NMOS sense amplifier NSA, which are disposed on both sides of the memory cell array block BLK1, perform the sensing operation so that the pair of sense bit lines SBL1 and SBL1B disposed on the right side of the memory cell array block BLK1 are supplied with 2.3 and −2.3 V, respectively, and the pair of sense bit lines SBL2 and SBL2B disposed on the left side thereof are supplied with −2.3 and 2.3 V, respectively.

During the period T2, the pairs of sense bit lines (SBL1, SBL1B) and (SBL2, SBL2B) perform sensing and amplification operations.

The controller 130 activates the isolation control signals IE1R1 and IE1L1 after the period T2. The column decoder 120 decodes the column address CA applied along with the read command RD and activates the column selection signal line CSL1.

Specifically, the isolation control signals IE1R1 and IE1L1 are activated and the column selection signal line CSL1 is activated during a period T3. Then, the NMOS transistors N8 of the isolation gates IS1 are turned on. Thus, a voltage of −2.3 V is applied from the inverted sense bit line SBL1B to the bit line BL1, and a voltage of 2.3 V is applied from the inverted sense bit line SBL2B to the bit line BL2. Accordingly, data "1" is restored in the memory cell M coupled between the word line WL11 and bit line BL1 of the memory cell array block BLK1, and data "0" is restored in the memory cell M coupled between the word line WL11 and bit line BL2 thereof. Also, the column selection gates CSG are turned on and transmit data from the pairs of sense bit lines (SBL1, SBL1) and (SBL2, SBL2B) to the corresponding pairs of data lines (D1, D1B) and (D12, D12B). That is, data are restored in the memory cells M and transmitted during the period T3. Thus, data in the memory cells M are read and restored during the read operation.

Although data "1" and data "0" have been used to describe reading and writing operations, such data levels are merely descriptive and may be any level during operation. Furthermore, although particular voltages such as 2.3V and 1.6V have been described, one skilled in the art will understand that such voltages are examples and other voltages may be used.

Further, the controller 130 activates the precharge control signal VPRE and applies the precharge voltage VBL in order to precharge the bit lines BL1, BL2, . . . and the pairs of sense bit lines (SBL1, SBL1B), (SBL2, SBL2B), . . . before and after the reference write operation, the write operation, and the read operation.

The memory cells M of the semiconductor memory device according may be refreshed in a similar manner as the read operation except that the column selection signals for activating the column selection signal lines CSL1 to CSLm are not activated. Also, the reference memory cells RM of the semiconductor memory device may be refreshed in a similar manner to the refresh operation of the memory cells M. In other words, the column selection signal lines CSL1 to CSLm for enabling the column selection gates CSG are inactivated and the same voltage as a voltage applied for the reference write operation is applied to the sense amplifier circuit SA, so that the reference memory cells RM can perform the refresh operation.

In an embodiment of a semiconductor memory device, the sense amplifier circuits correspond one-to-one to the bit lines. Accordingly, all the memory cells M can perform the refresh operation by activating the word line only once. As a result, since the semiconductor memory device activates the word line only once to perform the refresh operation, a time taken for the refresh operation can be shortened.

In addition, as described above, an embodiment of a semiconductor memory device has a simplified configuration of a sense amplifier circuit used for a data read operation and a reduced time for a refresh operation.

In one embodiment, a semiconductor memory device includes a memory cell array including a first memory cell array block and a second memory cell array block, the first memory cell array block including a memory cell having a floating body coupled to a word line, a first bit line, and a first source line, the second memory cell array block including a reference memory cell having a floating body coupled to a reference word line, a second bit line, and a second source line; a first isolation gate portion for transmitting a signal between the first bit line and an inverted sense bit line during a write operation and during a third period of a read operation and for transmitting a signal between the first bit line and a sense bit line during a first period of the read operation; a second isolation gate portion for transmitting a signal between the second bit line and the inverted sense bit line during the first period of the read operation; a precharge portion for precharging the sense bit line and the inverted sense bit line to a precharge voltage level during a precharge operation; and a sense amplifier for amplifying voltages of the sense bit line and the inverted sense bit line to first and second sense amplifying voltage levels during the write operation and during second and third periods of the read operation.

The first isolation gate portion may include a first transistor for transmitting a signal between the first bit line and the sense bit line in response to a first isolation control signal; and a second transistor for transmitting a signal between the first bit line and the inverted sense bit line in response to a second isolation control signal. Also, the second isolation gate portion may include a third transistor for transmitting a signal between the second bit line and the inverted sense bit line in response to a third isolation control signal.

The semiconductor memory device may further include a controller for activating the second isolation control signal and applying a sense amplifying voltage during the write operation, for activating the first isolation control signal and the third isolation control signal during the first period of the read operation, for applying first and second sense amplifying voltages during the write operation and during the second period of the read operation, and for activating the second isolation control signal and applying the first and second sense amplifying voltages during the third period of the read operation. The first sense amplifying voltage may be a positive first voltage, and the second sense amplifying voltage may be a negative second voltage. The controller may activate the third isolation control signal and apply a third sense amplifying voltage, which is different from the first sense amplifying voltage, during the reference write operation. The third sense amplifying voltage may have a voltage level between the positive first voltage and the negative second voltage. Also, the semiconductor memory device may perform the precharge operation before and after the write operation, before the first period of the read operation, and after the third period of the read operation.

In another embodiment, a semiconductor memory device includes a memory cell array including a first memory cell array block and a second memory cell array block, the first memory cell array block including first memory cells and first reference memory cells, each first memory cell having a floating body coupled to a first word line, a first bit line, and a first source line, each first reference memory cell having a floating body coupled to a first reference word line, the first bit line, and the first source line, the second memory cell array block including second memory cells and a second reference memory cell, each second memory cell having a floating body coupled to a second word line, a second bit line, and a second source line, the second reference memory cell having a floating body coupled to a second reference word line, the second bit line, and the second source line; a first isolation gate portion for transmitting a signal between the first bit line and an inverted sense bit line during a first write operation and during a third period of a first read operation, for transmitting a signal between the first bit line and a sense bit line during a first period of the first read operation, and for transmitting a signal between the first bit line and the inverted sense bit line during a third period of a second read operation; a second isolation gate portion for transmitting a signal between the second bit line and the inverted sense bit line during a second write operation and during the third period of the second read operation, for transmitting a signal between the second bit line and the sense bit line during a first period of the second read operation, and for transmitting a signal between the second bit line and the inverted sense bit line during the third period of the first read operation; a precharge portion for precharging the sense bit line and the inverted sense bit line to a precharge voltage level during a precharge operation; and a sense amplifier for amplifying voltages of the sense bit line and the inverted sense bit line to first and second sense amplifying voltage levels during the first and second write operations and during second and third periods of the first and second read operations.

The first isolation gate portion may include a first transistor for transmitting a signal between the first bit line and the sense bit line in response to a first isolation control signal; and a second transistor for transmitting a signal between the first bit line and the inverted sense bit line in response to a second isolation control signal. Also, the second isolation gate portion may include a third transistor for transmitting a signal between the second bit line and the sense bit line in response to a third isolation control signal; and a fourth transistor for transmitting a signal between the second bit line and the inverted sense bit line in response to a fourth isolation control signal.

The semiconductor memory device may further include a controller for activating the second isolation control signal and applying first and second sense amplifying voltages during the first write operation, for activating the first and fourth isolation control signals during the first period of the first read operation, applying the first and second sense amplifying voltages during the second and third periods of the first read operation, and activating the second isolation control signal during the third period of the first read operation, for activating the fourth isolation control signal and applying the first and second sense amplifying voltages during the second write operation, and for activating the second and third isolation control signals during the first period of the second read operation, applying the first and second sense amplifying voltages during the second and third periods of the second read operation, and activating the fourth isolation control signal during the third period of the second read operation. The first sense amplifying voltage may be a positive first voltage, and the second sense amplifying voltage may be a negative second voltage. Also, the controller may activate the second isolation control signal and apply a third sense amplifying voltage, which is different from one of the first and second sense amplifying voltages, during a first reference write operation, and may activate the fourth isolation control signal and apply the first and third sense amplifying voltages during a second reference write operation. The third sense amplifying voltage may have a voltage level between the positive first voltage and the negative second voltage.

The semiconductor memory device may perform the precharge operation before and after the first and second write operations, before the first period of the first and second read operations, and after the third period of the first and second read operations.

In another embodiment, the semiconductor memory device may further include a column selection gate portion for transmitting data between the sense bit line and a data input/output line and for transmitting data between the inverted sense bit line and an inverted data input/output line.

In another embodiment, the sense amplifier may include a PMOS sense amplifier including a first PMOS transistor and a second PMOS transistor that are coupled in series between the sense bit line and the inverted sense bit line and sense high-level data of one of the sense bit line and the inverted sense bit line to amplify the high-level data to the first sense amplifying voltage level; and an NMOS sense amplifier including a first NMOS transistor and a second NMOS transistor that are coupled in series between the sense bit line and the inverted sense bit line and sense low-level data of one of the sense bit line and the inverted sense bit line to amplify the low-level data to the second sense amplifying voltage level. The precharge portion may comprise a third NMOS transistor and a fourth NMOS transistor that are coupled in series between the sense bit line and the inverted sense bit line and precharge the sense bit line and the inverted sense bit line to the precharge voltage level in response to a precharge control signal.

Furthermore, the reference memory cell (or each of the first and second reference memory cells) may have a threshold voltage that is higher than a threshold voltage of one of the memory cells that stores data "1" and lower than a threshold voltage of one of the memory cells that stores data "0."

Another embodiment is a data write/read method for a semiconductor memory device including a memory cell array including a first memory cell array block and a second memory cell array block, the first memory cell array block including a memory cell having a floating body coupled to a word line, a first bit line, and a first source line, the second memory cell array block including a reference memory cell having a floating body coupled to a reference word line, a second bit line, and a second source line to store data of which level is intermediate between one of the memory cells that stores data "1" and one of the memory cells that stores data "0;" a precharge portion for precharging a sense bit line and an inverted sense bit line to a precharge voltage level; and a sense amplifier for amplifying voltages of the sense bit line and the inverted sense bit line to first and second sense amplifying voltage levels. The method includes: connecting the first bit line to the inverted sense bit line and transmitting the voltage of the inverted sense bit line, which is amplified by the sense amplifier, to the first bit line during a write operation; and connecting the first bit line to the sense bit line and connecting the second bit line to the inverted sense bit line to generate a voltage difference between the sense bit line and the inverted sense bit line during a first period of a read operation, and amplifying the voltages of the sense bit line and the inverted sense bit line to the first and second sense amplifying voltage levels using the sense amplifier and connecting the inverted sense bit line to the first bit line during second and third periods of the read operation.

The sense bit line and the inverted sense bit line may be precharged to the precharge voltage level using the precharge portion before and after the write operation, before the first period of the read operation, and after the third period of the read operation.

During the write operation, data "1" may be written in the memory cells due to impact ionization when the word line is activated and the inverted sense bit line is at a positive voltage level, and data "0" may be written in the memory cells due to forward biasing when the word line is activated and the inverted sense bit line is at a negative voltage level.

The first bit line may be disconnected from the sense bit line and the second bit line may be disconnected from the inverted sense bit line during the second period of the read operation, and the first bit line may be coupled to the inverted sense bit line during the third period of the read operation.

Embodiments have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device comprising:
a memory cell array including a first memory cell array block and a second memory cell array block, the first memory cell array block including a memory cell having a floating body connected to a word line, a first bit line, and a first source line, the second memory cell array block including a reference memory cell having a floating body connected to a reference word line, a second bit line, and a second source line;
a first isolation gate portion for transmitting a signal between the first bit line and an inverted sense bit line during a write operation and during a third period of a read operation, and for transmitting a signal between the first bit line and a sense bit line during a first period of the read operation;
a second isolation gate portion for transmitting a signal between the second bit line and the inverted sense bit line during the first period of the read operation;
a precharge portion for precharging the sense bit line and the inverted sense bit line to a precharge voltage level during a precharge operation; and
a sense amplifier for amplifying voltages of the sense bit line and the inverted sense bit line to first and second sense amplifying voltage levels during the write operation and during a second and the third periods of the read operation.

2. The device according to claim 1, further comprising a column selection gate portion for transmitting data between the sense bit line and a data input/output line, and for transmitting data between the inverted sense bit line and an inverted data input/output line.

3. The device according to claim 1, wherein the sense amplifier comprises:
a PMOS sense amplifier including a first PMOS transistor and a second PMOS transistor that are connected in series between the sense bit line and the inverted sense bit line and that sense high-level data of one of the sense bit line and the inverted sense bit line to amplify the high-level data to the first sense amplifying voltage level; and
an NMOS sense amplifier including a first NMOS transistor and a second NMOS transistor that are connected in series between the sense bit line and the inverted sense bit line and that sense low-level data of one of the sense bit line and the inverted sense bit line to amplify the low-level data to the second sense amplifying voltage level.

4. The device according to claim 3, wherein the reference memory cell has a threshold voltage that is higher than a threshold voltage of the memory cell when the memory cell stores data "1" and lower than a threshold voltage of the memory cell when the memory cell stores data "0."

5. The device according to claim 4, wherein the first isolation gate portion comprises:
   a first transistor for transmitting a signal between the first bit line and the sense bit line in response to a first isolation control signal; and
   a second transistor for transmitting a signal between the first bit line and the inverted sense bit line in response to a second isolation control signal.

6. The device according to claim 5, wherein the second isolation gate portion comprises a third transistor for transmitting a signal between the second bit line and the inverted sense bit line in response to a third isolation control signal.

7. The device according to claim 6, further comprising a controller for activating the second isolation control signal and applying a sense amplifying voltage during the write operation, for activating the first isolation control signal and the third isolation control signal during the first period of the read operation, for applying first and second sense amplifying voltages during the write operation and during the second period of the read operation, and for activating the second isolation control signal and applying the first and second sense amplifying voltages during the third period of the read operation.

8. The device according to claim 7, wherein the first sense amplifying voltage is a positive first voltage, and the second sense amplifying voltage is a negative second voltage.

9. The device according to claim 8, wherein the controller activates the third isolation control signal and applies a third sense amplifying voltage, which is different from the first sense amplifying voltage, during a reference write operation.

10. The device according to claim 9, wherein the third sense amplifying voltage has a voltage level between the positive first voltage and the negative second voltage.

11. The device according to claim 7, the precharge operation is performed before and after the write operation, before the first period of the read operation, and after the third period of the read operation.

12. The device according to claim 1, wherein the precharge portion comprises a third NMOS transistor and a fourth NMOS transistor that are connected in series between the sense bit line and the inverted sense bit line and that precharge the sense bit line and the inverted sense bit line to the precharge voltage level in response to a precharge control signal.

13. A semiconductor memory device comprising:
   a memory cell array including a first memory cell array block and a second memory cell array block, the first memory cell array block including first memory cells and first reference memory cells, each first memory cell having a floating body connected to a first word line, a first bit line, and a first source line, each first reference memory cell having a floating body connected to a first reference word line, the first bit line, and the first source line, the second memory cell array block including second memory cells and a second reference memory cell, each second memory cell having a floating body connected to a second word line, a second bit line, and a second source line, the second reference memory cell having a floating body connected to a second reference word line, the second bit line, and the second source line;
   a first isolation gate portion for transmitting a signal between the first bit line and an inverted sense bit line during a first write operation and during a third period of a first read operation, for transmitting a signal between the first bit line and a sense bit line during a first period of the first read operation, and for transmitting a signal between the first bit line and the inverted sense bit line during a third period of a second read operation;
   a second isolation gate portion for transmitting a signal between the second bit line and the inverted sense bit line during a second write operation and during the third period of the second read operation, for transmitting a signal between the second bit line and the sense bit line during a first period of the second read operation, and for transmitting a signal between the second bit line and the inverted sense bit line during the third period of the first read operation;
   a precharge portion for precharging the sense bit line and the inverted sense bit line to a precharge voltage level during a precharge operation; and
   a sense amplifier for amplifying voltages of the sense bit line and the inverted sense bit line to first and second sense amplifying voltage levels during the first and second write operations and during second periods and the third periods of the first and second read operations.

14. The device according to claim 13, further comprising a column selection gate portion for transmitting data between the sense bit line and a data input/output line, and for transmitting data between the inverted sense bit line and an inverted data input/output line.

15. The device according to claim 13, wherein the sense amplifier comprises:
   a PMOS sense amplifier including a first PMOS transistor and a second PMOS transistor that are connected in series between the sense bit line and the inverted sense bit line and that sense high-level data of one of the sense bit line and the inverted sense bit line to amplify the high-level data to the first sense amplifying voltage level; and
   an NMOS sense amplifier including a first NMOS transistor and a second NMOS transistor that are connected in series between the sense bit line and the inverted sense bit line and that sense low-level data of one of the sense bit line and the inverted sense bit line to amplify the low-level data to the second sense amplifying voltage level.

16. The device according to claim 13, wherein the precharge portion comprises a third NMOS transistor and a fourth NMOS transistor that are connected in series between the sense bit line and the inverted sense bit line and that precharge the sense bit line and the inverted sense bit line to the precharge voltage level in response to a precharge control signal.

17. The device according to claim 13, wherein each of the first and second reference memory cells has a threshold voltage that is higher than a threshold voltage of one of the first and second memory cells that stores data "1" and lower than a threshold voltage of one of the first and second memory cells that stores data "0."

18. The device according to claim 17, wherein the first isolation gate portion comprises:
   a first transistor for transmitting a signal between the first bit line and the sense bit line in response to a first isolation control signal; and
   a second transistor for transmitting a signal between the first bit line and the inverted sense bit line in response to a second isolation control signal.

19. The device according to claim 18, wherein the second isolation gate portion comprises:
   a third transistor for transmitting a signal between the second bit line and the sense bit line in response to a third isolation control signal; and a fourth transistor for transmitting a signal between the second bit line and the inverted sense bit line in response to a fourth isolation control signal.

20. The device according to claim 19, further comprising a controller for activating the second isolation control signal and applying first and second sense amplifying voltages during the first write operation, for activating the first and fourth isolation control signals during the first period of the first read operation, applying the first and second sense amplifying voltages during the second and third periods of the first read operation, and activating the second isolation control signal during the third period of the first read operation, for activating the fourth isolation control signal and applying the first and second sense amplifying voltages during the second write operation, and for activating the second and third isolation control signals during the first period of the second read operation, applying the first and second sense amplifying voltages during the second and third periods of the second read operation, and activating the fourth isolation control signal during the third period of the second read operation.

21. The device according to claim 20, wherein the first sense amplifying voltage is a positive first voltage, and the second sense amplifying voltage is a negative second voltage.

22. The device according to claim 21, wherein the controller activates the second isolation control signal and applies a third sense amplifying voltage, which is different from one of the first and second sense amplifying voltages, during a first reference write operation, and activates the fourth isolation control signal and applies the first and third sense amplifying voltages during a second reference write operation.

23. The device according to claim 22, wherein the third sense amplifying voltage has a voltage level between the positive first voltage and the negative second voltage.

24. The device according to claim 13, the precharge operation is performed before and after the first and second write operations, before the first period of the first and second read operations, and after the third period of the first and second read operations.

* * * * *